United States Patent [19]
Morzano

[11] Patent Number: 6,150,856
[45] Date of Patent: Nov. 21, 2000

[54] DELAY LOCK LOOPS, SIGNAL LOCKING METHODS AND METHODS OF IMPLEMENTING DELAY LOCK LOOPS

[75] Inventor: Christopher K. Morzano, Boise, Id.

[73] Assignee: Micron Technology, Inc., Boise, Id.

[21] Appl. No.: 09/303,076

[22] Filed: Apr. 30, 1999

[51] Int. Cl.[7] ............................................. H03L 7/06
[52] U.S. Cl. ..................... 327/149; 327/153; 327/158
[58] Field of Search ..................................... 327/149, 150, 327/153, 158, 159, 161

[56] References Cited

U.S. PATENT DOCUMENTS

| | | | |
|---|---|---|---|
| 5,638,410 | 6/1997 | Kuddes | 375/357 |
| 5,642,082 | 6/1997 | Jefferson | 331/25 |
| 5,663,665 | 9/1997 | Wang et al. | 327/3 |
| 5,712,884 | 1/1998 | Jeong | 375/375 |
| 5,717,353 | 2/1998 | Fujimoto | 327/276 |
| 5,744,991 | 4/1998 | Jefferson et al. | 327/158 |
| 5,771,264 | 6/1998 | Lane | 375/376 |

Primary Examiner—Tuan T. Lam
Attorney, Agent, or Firm—Wells, St. John, Roberts, Gregory & Matkin, P.S.

[57] ABSTRACT

Delay lock loops, signal locking methods, and methods of implementing delay lock loops are described. In one embodiment, a delay lock loop comprises a delay line having first and second inputs and an output. The first input is configured to receive a clock signal. An output model has an input and an output, with the input being operably coupled with the delay line output. The output model is configured to model delays in a system which can be driven by an output clock signal produced by the delay lock loop. A phase detector has a pair of inputs and an output. Phase detector's output is operably coupled with the second input of the delay line. A delay element is interposed between and operably couples both the (a) output of the output model, and (b) the clock signal received by the delay line, with respective inputs of the phase detector. The delay element is configured to present an additional delay to the phase detector which is in addition to the modeled delay provided by the output model. Other embodiments are described.

38 Claims, 2 Drawing Sheets

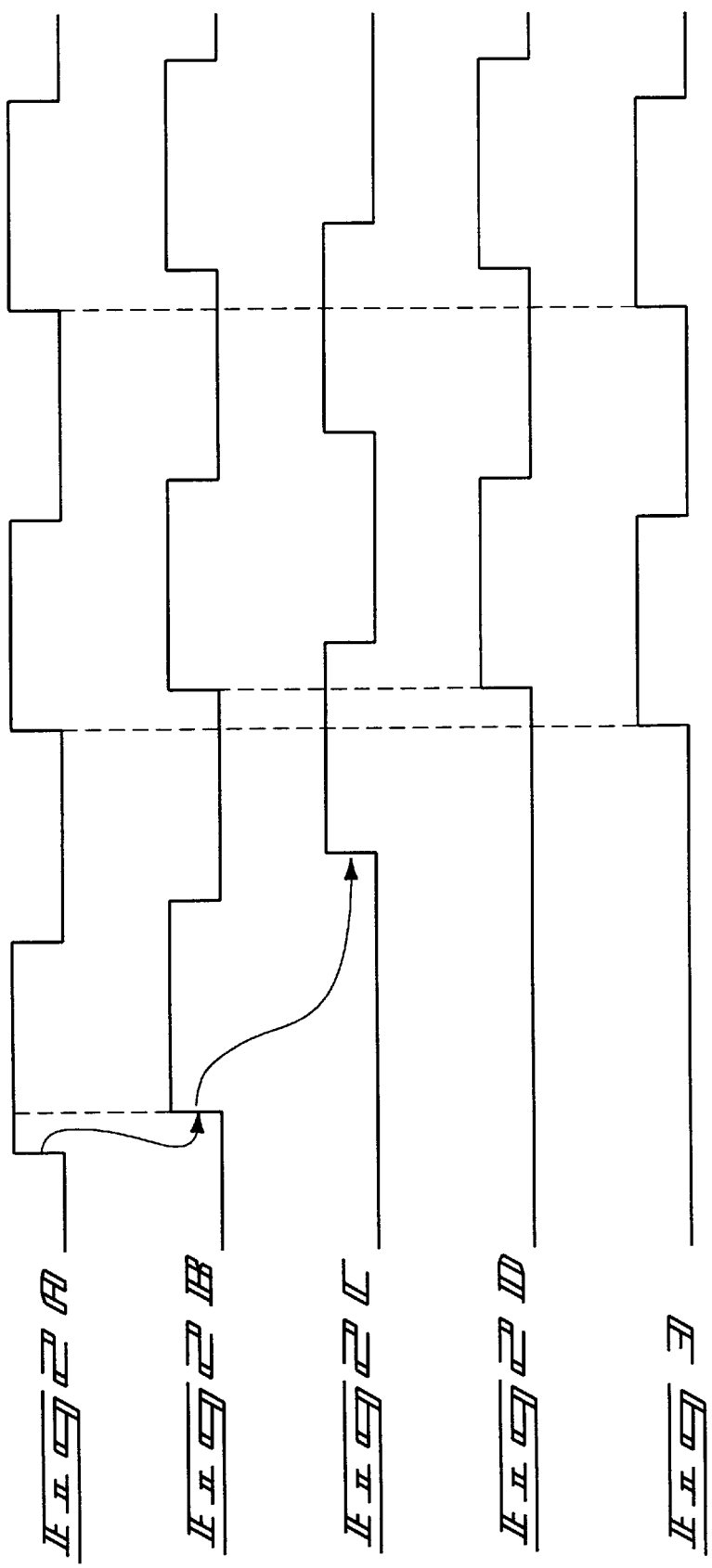

DELAY LOCK LOOPS, SIGNAL LOCKING METHODS AND METHODS OF IMPLEMENTING DELAY LOCK LOOPS

TECHNICAL FIELD

This invention pertains to delay lock loops, to signal locking methods and to methods of implementing delay lock loops.

BACKGROUND OF THE INVENTION

As the level of integration of digital integrated circuits increases, the generation and distribution of internal clock signals becomes more problematic. For example, distributing synchronous clock signals to many registers (e.g. thousands) throughout a very large scale integrated circuit can introduce significant clock skewing due to the parasitic resistive and capacitive loading of the clock signal lines.

One technique for minimizing clock skewing due to mass distribution of a synchronous clock signal is to use a phase lock loop (PLL) whereby a reference clock signal is distributed and used to generate and synchronize many local clock signals. The PLL can also be used to multiply the frequency of the reference clock signal thereby generating local clock signals which are synchronous frequency multiples of the reference clock signal.

Implementing a PLL in a typical digital integrated circuit is undesirable since the typical PLL requires the use of analog circuits, such as a voltage controlled oscillator, phase detector, charge pump, and low pass filter.

Other types of so-called locking loops have been commonly used for generating timing reference signals used in electronic circuits. One example of such a locking loop is a so-called delay lock loop or digital delay lock loop. The operation of exemplary locking circuitry or delay lock loops is described in the following patents, the disclosures of which are incorporated by reference: U.S. Pat. Nos. 5,663,665, 5,771,264, 5,642,082, and 5,744,991.

This invention arose out of concerns associated with providing improved delay lock loops and methods of signal locking, particularly in the area of implementing delay lock loops.

SUMMARY OF THE INVENTION

Delay lock loops, signal locking methods, and methods of implementing delay lock loops are described. In one embodiment, a delay lock loop comprises a delay line having first and second inputs and an output. The first input is configured to receive a clock signal. An output model has an input and an output, with the input being operably coupled with the delay line output. The output model is configured to model delays in a system which can be driven by an output clock signal produced by the delay lock loop. A phase detector has a pair of inputs and an output. Phase detector's output is operably coupled with the second input of the delay line. A delay element is interposed between and operably couples both the (a) output of the output model, and (b) the clock signal received by the delay line, with respective inputs of the phase detector. The delay element is configured to present an additional delay to the phase detector which is in addition to the modeled delay provided by the output model.

In another embodiment, a delay lock loop comprises a delay line having first and second inputs and an output. The delay line has a predetermined delay which is utilized to delay a clock signal which is received at the first input of the delay line. An output model has an input operably coupled with the output of the delay line, and an output. The output model is configured to model a delay in a system which can be driven by an output clock signal produced by the delay lock loop. A delay element comprises first and second delay circuitry having respective inputs and outputs. The first delay circuitry has its input coupled with the output of the output model. The second delay circuitry has its input coupled to receive the clock signal which is received by the first input of the delay line. A phase detector is operably coupled with the outputs of the first and second delay circuitry and has a phase detector output which is coupled with the second input of the delay line.

In yet another embodiment, a delay lock loop comprises a first clock input buffer for receiving a master clock signal and providing a first buffered output. A delay line is coupled with the first clock input buffer for delaying the first buffered output in accordance with a predetermined delay. A clock driver is coupled with the delay line for providing an output clock signal which is utilized to drive a system. An output model is coupled with the clock driver for modeling a delay in the system which is driven by the output clock signal provided by the clock driver. A second clock input buffer is coupled with the output model for providing a second buffered output. A delay element is coupled to receive the first and second buffered outputs and to provide delayed first and second buffered outputs. A phase detector is coupled with the delay element for receiving the delayed first and second buffered outputs and for providing an output which is received by the delay line. Signal locking methods and methods of implementing delay lock loops are described.

BRIEF DESCRIPTION OF THE DRAWINGS

Preferred embodiments of the invention are described below with reference to the following accompanying drawings.

FIGS. 2A–2D are signal waveform diagrams which are useful in explaining the operation of the circuitry depicted in FIG. 1.

FIG. 3 is a signal waveform diagram which is useful in explaining the operation of the circuitry shown in FIG. 1.

DETAILED DESCRIPTION OF THE PREFERRED EMBODIMENTS

Figure 1:
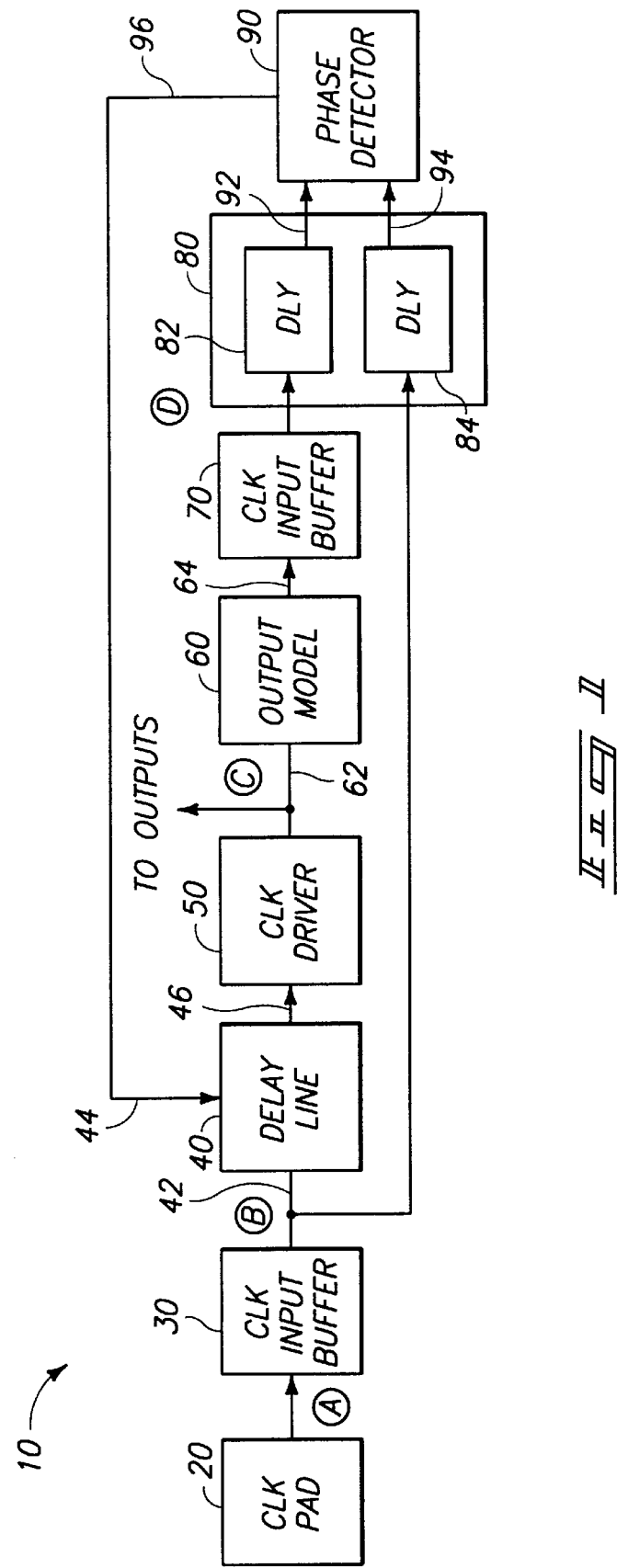
FIG. 1 is a high-level schematic view of a delay lock loop in accordance with one embodiment of the present invention.

This disclosure of the invention is submitted in furtherance of the constitutional purposes of the U.S. Patent Laws "to promote the progress of science and useful arts" (Article 1, Section 8).

Referring to FIG. 1, a delay lock loop in accordance with one or more embodiments of the present invention is shown generally at 10. In one embodiment, delay lock loop 10 comprises a delay line 40 having first and second inputs 42, 44 respectively, and an output 46. First input 42 is configured to receive a clock signal. In the illustrated example, the clock signal received by first input 42 originates from a clock pad 20 and is passed through a clock input buffer 30. Delay line 40 can comprise any suitable known delay line. Exemplary delay lines are described in one or more of the patents incorporated by reference above.

An output model 60 is provided and has an input 62 operably coupled with delay line output 46, and an output 64. Output model 60 is configured to model delays in a system which can be driven by an output clock signal which is produced by delay lock loop 10. Output model 60 can comprise any suitable output model, exemplary ones of which are described in one or more of the patents incorporated by reference above.

A phase detector 90 is provided and has a pair of inputs 92, 94 and an output 96. The phase detector's output 96 is operably coupled with second input 44 of delay line 40. The phase detector is configured to maintain its inputs in phase, and responsive to a condition where they are out of phase, provide suitable control signals to delay line 40 to rectify the out of phase condition, as is known.

A delay element 80 is provided and is interposed between and operably couples both the output 64 of output model 60 and a clock signal which is received by delay line 40 with the respective inputs 92, 94 of phase detector 90. Delay element 80 is preferably configured to present an additional delay to the phase detector which is in addition to the modeled delay provided by output model 60. In one embodiment, delay lock loop 10 further includes a clock driver 50 having an input and an output. The input of clock driver 50 is preferably coupled to the output 46 of delay line 40. The output of clock driver 50 is coupled to input 62 of output model 60. Preferably, the output of clock driver 50 provides the output clock signal which is utilized to drive a system.

In another embodiment, delay lock loop 10 includes a clock input buffer 70 having an input and an output. The input of clock input buffer 70 is coupled with output 64 of output model 60. The output of clock input buffer 70 is coupled with delay element 80.

Delay element 80 can be implemented in any suitable manner including analog and digital circuits. In one embodiment, delay element 80 comprises an RC delay element.

In another embodiment, the clock signal which is received by delay line 40 is a buffered signal from a master clock provided by clock pad 20, and the output clock signal which is provided by the delay lock loop is utilized fire data in a manner which generally coincides with an edge of the master clock as will become apparent below.

In another embodiment, delay lock loop 10 comprises a delay line 40 having first and second inputs 42, 44 respectively, and an output 46. Delay line 40 has a predetermined delay which is utilized to delay a clock signal which is received at first input 42. An output model 60 is provided and has an input 62 operably coupled with the output of delay line 40. The output model is preferably configured to model a delay in a system which can be driven by an output clock signal produced by the delay lock loop.

A delay element 80 is provided and comprises first and second delay circuitry 82, 84 having respective inputs and outputs. First delay circuitry 82 has its input coupled with the output of output model 60. Second delay circuitry 84 has its input coupled to receive the clock signal which is received by first input 42 of delay line 40. A phase detector 90 is provided and is operably coupled with the outputs of first and second delay circuitry 82, 84 respectively. Phase detector 90 has an output 96 which is coupled with the second input 44 of delay line 40.

In one embodiment, first and second delay circuitry 82, 84 are configured to provide respective delays which are substantially matched. In another embodiment, first and second delay circuitry 82, 84 comprise analog delay circuitry. In another embodiment, first and second delay circuitry 82, 84 comprise analog delay circuitry comprising respective capacitive loads. In yet another embodiment, first and second delay circuitry 82, 84 comprise RC delay circuitry. In another embodiment, first and second delay circuitry 82, 84 comprise analog delay circuitry and are configured to provide respective delays which are substantially matched. In another embodiment, first and second delay circuitry 82, 84 comprise RC delay circuitry and are configured to provide respective delays which are substantially matched. In yet another embodiment, first and second delay circuitry 82, 84 are configured to collectively provide a delay which is smaller in magnitude than the delay provided by delay line 40.

In another embodiment, delay lock loop 10 comprises a clock input buffer 70 coupled between the input of first delay circuitry 82 and output 64 of output model 60.

In another embodiment, delay lock loop 10 comprises a first clock input buffer 30 for receiving a master clock signal, such as one received from clock pad 20. First clock input buffer 30 provides at its output a first buffered output. A delay line 40 is coupled with first clock input buffer 30 for delaying the first buffered output in accordance with a predetermined delay. A clock driver 50 is coupled with delay line 40 for providing an output clock signal which is utilized to drive a system. An output model is coupled with clock driver 50 for modeling a delay in the system which is driven by the output clock signal provided by clock driver 50. A second clock input buffer 70 is coupled with output model 60 for providing a second buffered output. A delay element 80 is coupled to receive the first and second buffered outputs and to provide delayed first and second buffered outputs. A phase detector 90 is coupled with delay element 80 for receiving the delayed first and second buffered outputs and for providing an output 96 which is received by delay line 40.

In one embodiment, delay element 80 comprises first and second delay elements 82, 84 which respectively receive the first and second buffered outputs. In another embodiment, first and second delay elements 82, 84 are configured to substantially similarly delay the first and second buffered outputs. In another embodiment, delay element 80 comprises first and second delay circuitry which respectively receive the first and second buffered outputs. In another embodiment, the first and second delay circuitry are configured to substantially similarly delay the first and second buffered outputs. In another embodiment, delay element 80 comprises first and second RC circuitry 82, 84 which respectively receive the first and second buffered outputs. In another embodiment, the first and second RC circuitry 82, 84 are configured to substantially similarly delay the first and second buffered outputs. In another embodiment, delay element 80 is configured to provide a delay which is less than the delay provided by delay line 40.

In one embodiment, a signal locking method comprises providing a clock signal and passing the clock signal to a delay line 40 for providing a delayed clock signal. The delayed clock signal is driven with a clock driver 50 to provide a driven output clock signal which can be used to drive a system. The driven output clock signal is passed to circuitry comprising an output model 60 configured to model a delay of the system which can be driven by the output clock signal. The circuitry comprising output model 60 includes an output, which, together with the clock signal which is passed to delay line 40, is passed to a delay element 80 having delayed outputs which correspond to its inputs. The delayed outputs of delay element 80 are passed to clock signal detection circuitry 90 which is configured to detect whether the delayed outputs are desirably locked. In one embodiment, clock signal detection circuitry 90 comprises a phase detector.

In another embodiment, delay element 80 comprises first and second delay circuits 82, 84 which are configured to respectively receive the output of the circuitry comprising output model 60 and the clock signal received by delay line 40 and to substantially similarly delay the same. In one embodiment, delay element 80 comprises at least one RC delay circuit. In another embodiment, delay element 80 comprises first and second RC delay circuits 82, 84.

Referring to FIGS. 1, 2A–2D, and 3, operational aspects of delay lock loop 10 are described.

FIGS. 2A–2D correspond to exemplary waveforms which are present at nodes A, B, C, and D in FIG. 1. A clock signal from clock pad 20 is shown in FIG. 2A. The clock signal is passed to clock input buffer 30 to provide, as shown in FIG. 2B, a slightly delayed clock signal. Delayed clock signal B is passed to delay line 40 and onto clock driver 50 to provide the waveform shown in FIG. 2C. The waveform shown in FIG. 2C is utilized to drive the system mentioned above. In one embodiment, the system includes outputs which have an inherent delay causing them to fire in accordance with the waveform shown in FIG. 3. The waveform signal of FIG. 2C is passed through output model 60 which models delays in the system and through a clock input buffer to provide a waveform shown in FIG. 2D. The waveforms shown in FIG. 2B and 2D are passed to delay element 80 which, in a preferred embodiment, substantially similarly delays the waveforms and provides them to phase detector 90 which ensures that the waveforms are locked.

Typical delay lock loops must be designed for a range of frequencies. A number of delays in the delay line, such as delay line 40, is dependent on this range, and the delay of each element in the delay line equals the smallest accuracy of the DLL, so it takes up much chip area to create a large frequency range. By adding a delay, such as that provided by the various embodiments of delay element 80, on top of an output model 60, and matching it on the clock input for phase detector 90, the delay lock loop will be forced to lock on the second clock in the line for any clock cycle faster than the model and the added delay. Hence, the frequency range the delay line needs to support can be decreased and, therefore, the number of delay line elements can be decreased. This can result in decreases in the layout area needed without sacrificing frequency range or delay lock loop performance. Various embodiments of the invention can be employed in high-speed integrated circuits where alignment must take place with an external clock signal.

As an example, a delay lock loop needs to be able to lock on a clock cycle of 5 nanoseconds to 20 nanoseconds. Assume also that the output model 60 and clock input buffer 70 provide a total of 2 nanoseconds of delay. Accordingly, delay line 40 must provide enough elements to add up to 20 nanoseconds minus 2 nanoseconds or, 18 nanoseconds of delay. However, if delay element 80 is provided and adds a big enough delay, say for example 8 nanoseconds, then delay line 40 need only provide a delay of 10 nanoseconds to equal the desired 18 nanoseconds, because any clock cycle less than 10 nanoseconds will lock on the second cycle. This means than the layout area need for implementing the delay line can be reduced thereby resulting in a savings in wafer real estate. Accordingly, various embodiments of the invention can decrease the layout area needed without sacrificing frequency range or DLL performance.

Other advantages will be apparent to those of skill in the art.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A delay lock loop comprising:

a delay line having first and second inputs and an output, the first input being configured to receive a clock signal;

a clock driver having an input coupled to the output of the delay line and configured to drive the delayed clock signal to provide a driven output clock signal at a clock driven output to drive a system;

an output model having an input coupled to the clock driver output, and an output, the output model being configured to model delays in the system and provide a modeled delay at the output of the output model;

a phase detector having a pair of inputs and an output, the phase detector's output being operably coupled with the second input of the delay line; and a delay element having a first input coupled to the output of the output model, having a second input coupled to the clock signal received by the delay line; and having first and second outputs coupled to the inputs of the phase detector, the delay element being configured to present an additional delay to the phase detector which is in addition to the modeled delay provided by the output model.

2. The delay lock loop of claim 1 further comprising a clock input buffer having an input and an output, the input of the clock input buffer being coupled with the output of the output model, and the output of the clock input buffer being coupled with the delay element.

3. The delay lock loop of claim 1, wherein the delay element comprises at least one RC delay element.

4. The delay lock loop of claim 1, wherein the clock signal received by the delay line is a buffered signal from a master clock.

5. A delay lock loop comprising:

a delay line having first and second inputs and an output, the delay line having a predetermined delay which is utilized to delay a clock signal which is received at the first input of the delay line;

a clock driver configured to receive the delayed clock signal and to provide a driven output clock signal to a system that requires a clock signal, the clock output being coupled to the output of the delay line;

an output model having an input operably coupled with the output of the clock driver, and an output, the output model being configured to model a delay in the system;

a delay element comprising first and second delay circuitry having respective inputs and outputs, the first delay circuitry having its input coupled with the output of the output model, the second delay circuitry having its input coupled to receive the clock signal; and a phase detector operably coupled with the outputs of the first and second delay circuitry and having a phase detector output which is coupled with the second input of the delay line.

6. The delay lock loop of claim 5, wherein the first and second delay circuitry are configured to provide respective delays which are substantially matched.

7. The delay lock loop of claim 5, wherein the first and second delay circuitry comprise analog delay circuitry.

8. The delay lock loop of claim 5, wherein the first and second delay circuitry comprise analog delay circuitry comprising respective capacitive loads.

9. The delay lock loop of claim 5, wherein the first and second delay circuitry comprise RC delay circuitry.

10. The delay lock loop of claim 5, wherein the first and second delay circuitry comprise analog delay circuitry and are configured to provide respective delays which are substantially matched.

11. The delay lock loop of claim 5, wherein the first and second delay circuitry comprise RC delay circuitry and are configured to provide respective delays which are substantially matched.

12. The delay lock loop of claim 5, wherein the first and second delay circuitry are configured to collectively provide a delay which is smaller in magnitude than the delay provided by the delay line.

13. The delay lock loop of claim 5 further comprising a clock input buffer coupled between the input of the first delay circuitry and the output of the output model.

14. A delay lock loop comprising:
a first clock input buffer for receiving a master clock signal and providing a first buffered output;
a delay line coupled with the first clock input buffer for delaying the first buffered output in accordance with a predetermined delay;
a clock driver coupled with the delay line for providing an output clock signal which is utilized to drive a system;
an output model coupled with the clock driver for modeling a delay in the system which is driven by the output clock signal provided by the clock driver;
a second clock input buffer coupled with the output model for providing a second buffered output;
a delay element coupled to receive the first and second buffered outputs and to provide delayed first and second buffered outputs; and
a phase detector coupled with the delay element for receiving the delayed first and second buffered outputs and for providing an output which is received by the delay line.

15. The delay lock loop of claim 14, wherein the delay element comprises first and second delay elements which respectively receive the first and second buffered outputs.

16. The delay lock loop of claim 14, wherein the delay element comprises first and second delay elements which respectively receive the first and second buffered outputs and is configured to substantially similarly delay the first and second buffered outputs.

17. The delay lock loop of claim 14, wherein the delay element comprises first and second delay circuitry which respectively receive the first and second buffered outputs.

18. The delay lock loop of claim 14, wherein the delay element comprises first and second delay circuitry which respectively receive the first and second buffered outputs and is configured to substantially similarly delay the first and second buffered outputs.

19. The delay lock loop of claim 14, wherein the delay element comprises first and second RC circuitry which respectively receive the first and second buffered outputs.

20. The delay lock loop of claim 14, wherein the delay element comprises first and second RC circuitry which respectively receive the first and second buffered outputs and is configured to substantially similarly delay the first and second buffered outputs.

21. The delay lock loop of claim 14, wherein the delay element is configured to provide a delay which is less than the delay provided by the delay line.

22. A signal locking method comprising:
providing a clock signal;
passing the clock signal to a delay line for providing a delayed clock signal;
driving the delayed clock signal with a clock driver to provide a driven output clock signal which is used to drive a system;
passing the driven output clock signal to a circuit comprising an output model configured to model a delay of said system, said circuit having an output;
passing both (a) the output of said circuit and (b) said clock signal which is passed to the delay line, to a delay element having delayed outputs corresponding to the output of said circuit and said clock signal; and
passing said delayed outputs of the delay element to a clock signal detection circuitry configured to detect whether said delayed outputs are desirably locked.

23. The signal locking method of claim 22, wherein the clock signal detection circuitry comprises a phase detector.

24. The signal locking method of claim 22, wherein the delay element comprises first and second delay circuits configured to respectively receive the output of said circuitry and said clock signal, and to substantially similarly delay the same.

25. The signal locking method of claim 22, wherein the delay element comprises at least one RC delay circuit.

26. The signal locking method of claim 22, wherein the delay element comprises first and second RC delay circuits.

27. A method of implementing a delay lock loop comprising:
providing a delay line having first and second inputs and an output, the first input being configured to receive a clock signal;
providing an output clock signal to drive a system external of the delay lock loop, the output clock signal being derived from the output of the delay line;
using an output model having an input operably coupled to the output clock signal, and an output, to model delays in the system;
coupling an output of a phase detector having a pair of inputs, with the second input of the delay line; and
coupling a first input of a delay element to the output of the output model, coupling a second input of the delay element to the clock signal received by the delay line, and coupling first and second outputs of the delay element with respective inputs of the phase detector, the delay element being configured to present an additional delay to the phase detector which is in addition to the modeled delay provided by the output model.

28. The method of claim 27 further comprising providing a clock driver having an input and an output, the input of the clock driver being coupled to the output of the delay line, and the output of the clock driver being coupled to the input of the output model.

29. The method of claim 27 further comprising providing a clock driver having an input and an output, the input of the clock driver being coupled to the output of the delay line, and the output of the clock driver being coupled to the input of the output model, and wherein the output of the clock driver provides said output clock signal.

30. The method of claim 27 further comprising providing a clock input buffer having an input and an output, the input of the clock input buffer being coupled with the output of the output model, and the output of the clock input buffer being coupled with the delay element.

31. The method of claim 27 further comprising:

providing a clock driver having an input and an output, the input of the clock driver being coupled to the output of the delay line, and the output of the clock driver being coupled to the input of the output model, and wherein the output of the clock driver provides said output clock signal; and providing a clock input buffer having an input and an output, the input of the clock input buffer being coupled with the output of the output model, and the output of the clock input buffer being coupled with the delay element.

32. A method of implementing a delay lock loop comprising:

providing a delay line having first and second inputs and an output, the delay line having a predetermined delay which is utilized to delay a clock signal which is received at the first input of the delay line;

providing an output model having an input operably coupled with the output of the delay line, and an output, the output model being configured to model a delay in a system which can be driven by an output clock signal produced by the delay lock loop;

providing a delay element comprising first and second delay circuitry having respective inputs and outputs, the first delay circuitry having its input coupled with the output of the output model, the second delay circuitry having its input coupled to receive the clock signal which is received by the first input of the delay line; and providing a phase detector operably coupled with the outputs of the first and second delay circuitry and having a phase detector output which is coupled with the second input of the delay line.

33. The method of claim 32, wherein the providing of the first and second delay circuitry comprises configuring said circuitry to provide respective delays which are substantially matched.

34. The method of claim 32, wherein the providing of the first and second delay circuitry comprises configuring said circuitry with analog delay circuitry.

35. The method of claim 32, wherein the providing of the first and second delay circuitry comprises configuring said circuitry with analog delay circuitry comprising respective capacitive loads.

36. A method of implementing a delay lock loop comprising:

providing a first clock input buffer for receiving a master clock signal and providing a first buffered output;

providing a delay line coupled with the first clock input buffer for delaying the first buffered output in accordance with a predetermined delay;

providing a clock driver coupled with the delay line for providing an output clock signal which is utilized to drive a system; providing an output model coupled with the clock driver for modeling a delay in the system which is driven by the output clock signal provided by the clock driver;

providing a second clock input buffer coupled with the output model for providing a second buffered output;

providing a delay element coupled to receive the first and second buffered outputs and to provide delayed first and second buffered outputs; and providing a phase detector coupled with the delay element for receiving the delayed first and second buffered outputs and for providing an output which is received by the delay line.

37. The method of claim 36, wherein the providing of the delay element comprises providing first and second delay elements which respectively receive the first and second buffered outputs.

38. The method of claim 36, wherein the providing of the delay element comprises providing first and second delay elements which respectively receive the first and second buffered outputs and substantially similarly delaying the first and second buffered outputs.

* * * * *